United States Patent [19]
Cowles et al.

[11] Patent Number: 5,995,426
[45] Date of Patent: Nov. 30, 1999

[54] TESTING PARAMETERS OF AN ELECTRONIC DEVICE

[75] Inventors: Timothy B. Cowles; Jeffery P. Wright, both of Boise, Id.

[73] Assignee: Micron Technology, Inc., Nampa, Id.

[21] Appl. No.: 08/964,429

[22] Filed: Nov. 4, 1997

[51] Int. Cl.⁶ ................................................. G11C 7/00
[52] U.S. Cl. .......................... 365/201; 365/233; 365/203
[58] Field of Search ................................ 365/201, 233, 365/203

[56] References Cited

U.S. PATENT DOCUMENTS 5,548,560  8/1996  Stephens, Jr. et al. .............. 365/233.5
5,754,486  5/1998  Nevill et al. ............................. 365/201
5,757,705  5/1998  Manning ................................. 365/201
5,809,038  9/1998  Martin ..................................... 371/21.2

*Primary Examiner*—David Nelms
*Assistant Examiner*—Tuan T. Nguyen
*Attorney, Agent, or Firm*—Trop, Pruner, Hu & Miles, P.C.

[57] ABSTRACT

A method for testing an electronic device includes causing the device to perform an operation. Using circuitry of the device, a duration of time is asynchronously measured in association with the step of causing. The operation is controlled in response to the expiration of the duration.

28 Claims, 4 Drawing Sheets

TESTING PARAMETERS OF AN ELECTRONIC DEVICE

BACKGROUND

The invention relates to testing parameters of an electronic device.

The electrical properties of semiconductor devices vary from device to device. These variations occur even when semiconductor devices are of the same type and are fabricated on the same wafer. In recognition of these variations, manufacturers of the semiconductor devices typically perform several tests on each device to test various electrical parameters of the device and verify that certain minimum standards are met.

The tests are typically conducted using a tester that furnishes test signals (e.g., address, data and control signals) to the device being tested. The tester generates several internal clock signals that are used to clock the transitions of the test signals. Although the clock signals have the same frequency, the relative phases of the clock signals are adjusted to test different parameters of the device.

For example, to test an address setup time $t_{AS}$ of a synchronous dynamic random access memory (SDRAM), one of the test signals provided by the tester is a system clock signal that clocks operations of the SDRAM and is synchronized to one of the internal clock signals. The tester also provides a group of different test signals that are indicative of an address in the SDRAM. This group of signals is synchronized to another one of the internal clock signals of the tester and is slightly offset in phase from the system clock signal. Thus, the address setup time tested is represented by the difference in phase between the two internal clock signals.

As a result of this type of testing, the period of the internal clock signals of the tester may be relatively long compared to the time interval tested. However, this type of testing does accommodate the situation where one of the test signals must transition between two states faster than the period of the internal clock signal.

Referring to FIG. 1, as an example, for a memory device (e.g., a SDRAM 12), a test sequence might be used to evaluate how quickly the memory device performs a write operation, i.e., the test sequence evaluates a write recovery time interval $t_{WR}$ of the device. In this test sequence, a tester 10 interacts with the SDRAM 12 to initiate and control a sequence of write operations. The tester 10 limits the duration of each write operation to a maximum acceptable write recovery time interval. If defective, the SDRAM 12 is not able to store test data (furnished by the tester 10) in its memory cells due to the time limitation imposed by the tester 10. Thus, the tester 10 completes the test by reading values from the memory cells and comparing the test data to the values that are read.

Referring to FIG. 2, the tester 10 typically furnishes a write enable signal WE#, a write command and other signals to control each write operation. The SDRAM 12 begins the write operation at time $T_{START}$ when the SDRAM 12 latches the write command on a positive edge of a clock signal (called CLK). If the write command is not present on the next positive edge of the CLK signal, then a duration 15 of the write operation is one period of the CLK signal.

As a result of this type of testing, the minimum time interval that may be tested is equal to the period of the clock signal CLK. However, due to nonideal properties (e.g., rise and fall times) of the clock signal CLK, the period of the clock signal CLK typically has to be much smaller than the time interval tested.

SUMMARY OF THE INVENTION

In general, in one aspect, the invention features a method for testing an electronic device. The electronic device is capable of controlling an operation during a normal mode in response to the detection of both a predetermined state of a first signal and a predetermined state of a second signal. The method includes, during a test mode of the device, detecting the predetermined state of the first signal. The operation is controlled in response to the detection of the predetermined state of the first signal without using the predetermined state of the second signal.

Implementations may include one or more of the following. The second signal may be a clock signal, and the predetermined state may be an edge of the clock signal. The step of controlling may include halting or starting the operation. The step of controlling may also include generating a delay after the step of detecting.

In general, in another aspect, the invention features a method for testing an electronic device. The method includes causing the device to perform an operation, and using circuitry of the device, a duration of time is asynchronously measured in association with the step of causing. The operation is controlled in response to the expiration of the duration.

Implementations of the invention may include one or more of the following. The causing step may include furnishing a command to the electronic device (e.g., a memory device, such as a synchronous dynamic random access memory). The controlling step may include halting the operation (e.g., a write operation). The operation may be synchronized to a clock signal. The duration may be a minimum write recovery time.

In general, in another aspect, the invention features a method for use with an electronic device that is capable of performing an operation. The operation is synchronized to a clock signal that has timing edges. The method includes furnishing a command to the electronic device to initiate the operation. The command is latched by the electronic device on one of the timing edges. Circuitry of the electronic device is used to control a duration of the operation. The duration is independent of the timing edges.

Implementations of the invention may include one or more of the following. The method may also include furnishing a signal external to the electronic device to enable the operation and terminating the operation independently of a state of the signal. The operation may include a write operation.

In general, in another aspect, the invention features a method for testing a memory device. The method includes providing a clock signal to the memory device and furnishing a sequence of commands to the memory device for storing first data in memory cells of the memory device. The memory device performs operations in response to each of the commands, and the operations are synchronized to the clock signal. At least one of the operations is asynchronously halted. After the sequence, second data is read from the memory cells, and the first and second data are compared.

Implementations of the invention may include one or more of the following. The halting may include initiating precharging of the memory cells. The operation that is asynchronously halted may be a write operation.

In general, in another aspect, the invention features a method for testing a memory device. The method includes providing a clock signal to the memory device and furnishing a sequence of commands to the memory device for storing first data in memory cells of the memory device. The memory device performs operations in response to each of the commands, and the operations being synchronized to the clock signal. At least one of the operations are asynchronously halted, and second data is read from the memory cells after the sequence. The first and second data are compared.

Implementations of the invention may include one or more of the following. The test logic may be configured to terminate the operation after a predetermined duration elapses from when the operation enable signal indicates the first state.

In general, in another aspect, the invention features a memory device that includes a memory cell and a circuit. The circuit is configured to, in a normal mode, receive an external operation enable signal, perform an operation on the memory cell when the operation enable signal indicates a first state, and terminate the operation when the operation enable signal indicates a second state. The memory devices includes test logic that is configured to, in a test mode, interact with the circuit to terminate the operation when the operation enable signal indicates the first state.

In general, in another aspect, the invention features an electronic device that has a first circuit and a second circuit. The first circuit is configured to perform an operation. The second circuit is configured to asynchronously measure a duration of time in association with the operation and interact with the first circuit to control the operation in response to the expiration of the duration.

Among the advantages of the invention are one or more of the following. Electrical parameters of the memory device may be tested independently of the frequency of a test clock signal. Less expensive testers that cannot operate at high frequencies may be used to test the memory device. Time intervals having a shorter duration than the period of the clock signal may be measured. Test circuitry may be fabricated into the memory device.

Other advantages and features will become apparent from the following description and from the claims.

BRIEF DESCRIPTION OF THE PREFERRED EMBODIMENTS

Figure 1:
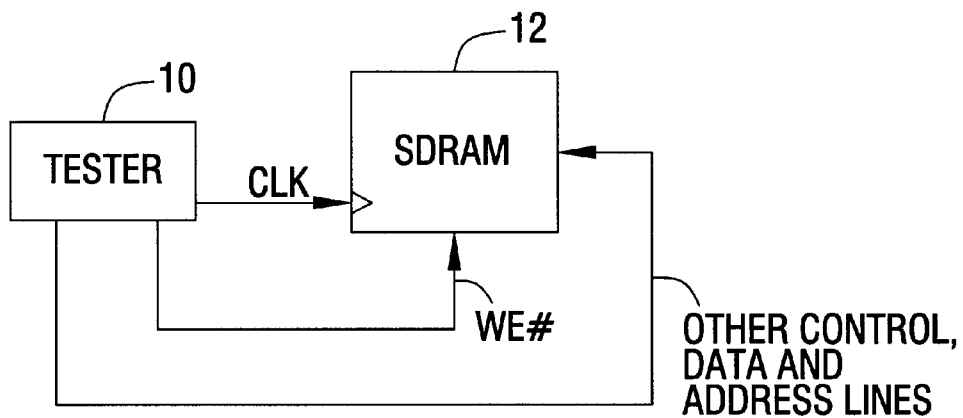
FIG. 1 is an electrical block diagram of a prior art testing system.
Figure 2:
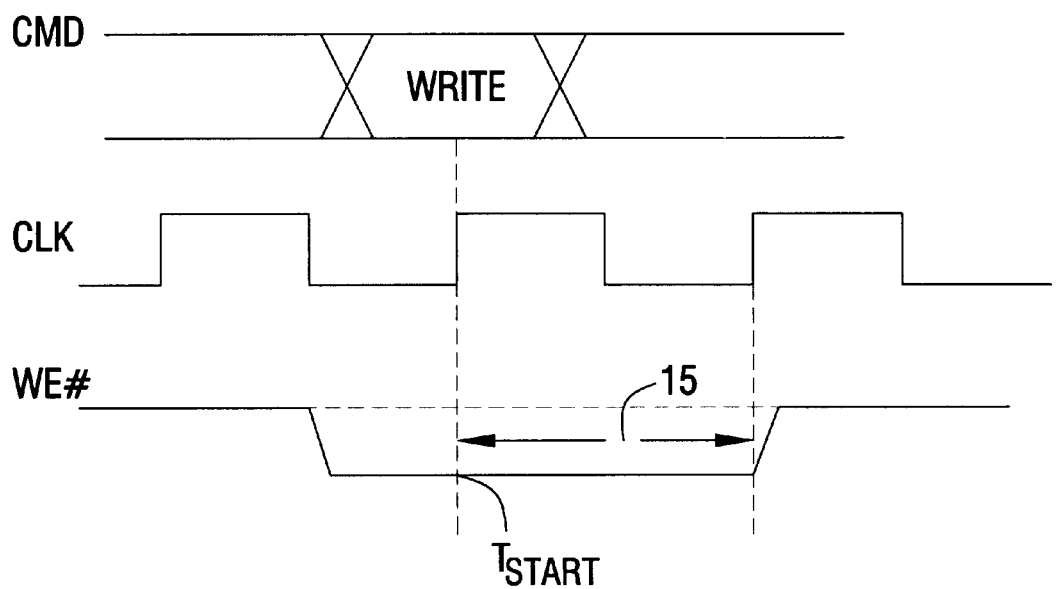
FIG. 2 are waveforms of signals received by a synchronous dynamic random access memory of FIG. 1.
Figure 3:
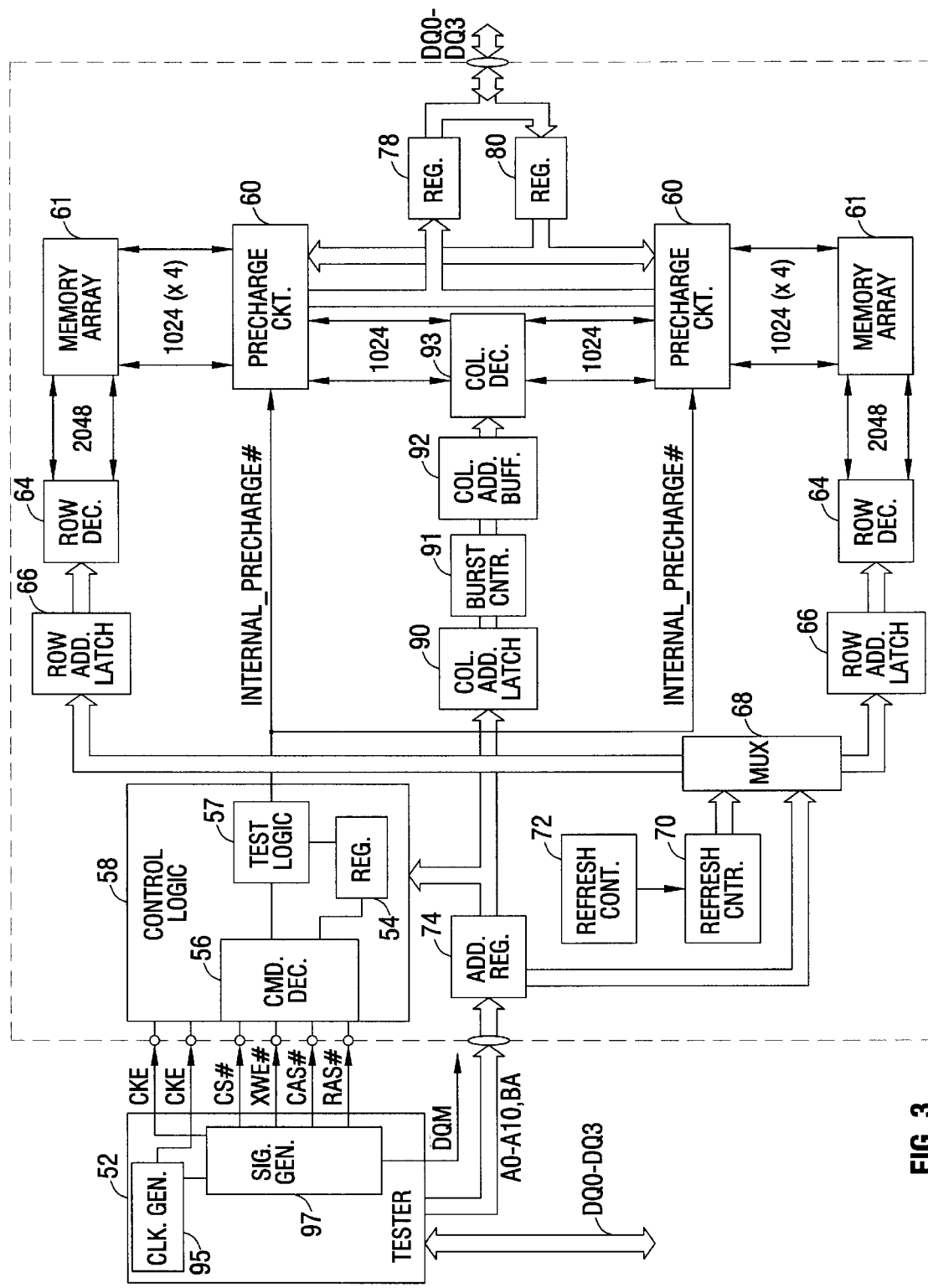
FIG. 3 is an electrical block diagram of a synchronous dynamic random access memory.
Figure 4:
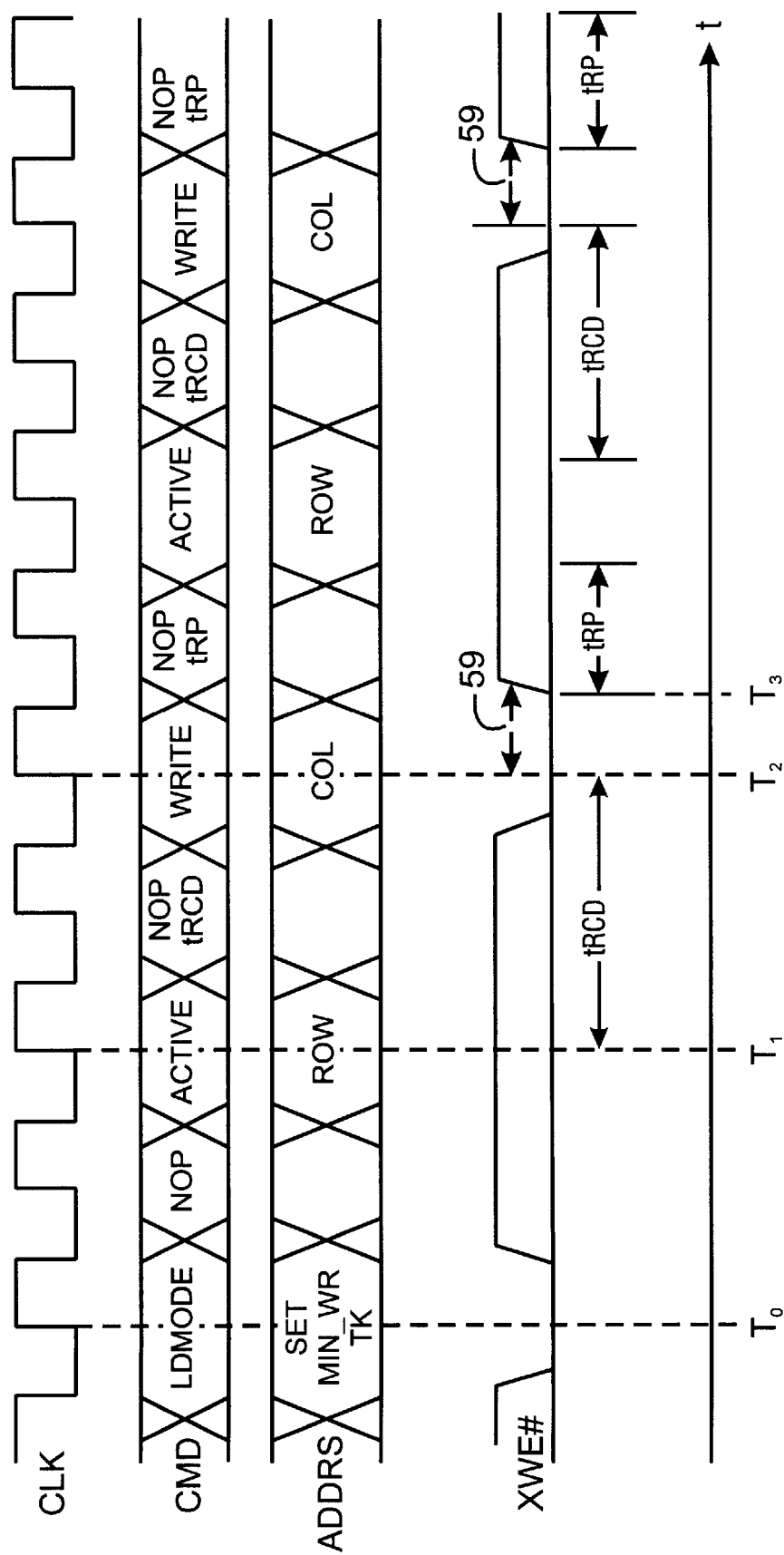
FIG. 4 are waveforms of signals received by the memory of FIG. 3.

Referring to FIGS. 3 and 4, interdependent signals (e.g., a system clock signal called CLK and a write enable signal called XWE#) typically are used in conjunction to control an operation (e.g., a write operation) of an electronic device, such as a synchronous dynamic random access memory (SDRAM) 50. However, unlike typical devices, the SDRAM 50 is constructed to, during a test mode, effectively eliminate the interdependency of some of these signals.

For example, although signals that control a write operation of the SDRAM 50 are typically used in conjunction with the system clock signal, the SDRAM 50 is constructed to, during a test mode, asynchronously measure a duration 59 of the write operation. As a result, the duration 59 is independent of the frequency (and period) of the system clock signal, and the tester 52 does not require a high frequency clock generator (e.g., a 150 Mhz clock generator).

Although other parameters of the SDRAM 50 may be tested, in one example, the tester 52 is configured to evaluate a write recovery time $t_{WR}$ of the SDRAM 50 by initiating write operations which are asynchronously limited to the duration 59 by the SDRAM 50.

Before initiating a write operation, the tester 52 asserts, or drives low, the write enable signal XWE#, to enable the SDRAM 50 to perform the write operation. In the write operation, the SDRAM 50 attempts to store data in a selected memory cell. However, the write operation may not be successful due to the time restraint placed on the operation by the tester 52. The duration 59 represents a minimum acceptable write recovery time interval for $t_{WR}$.

The tester 52 evaluates the write recovery time interval $t_{WR}$ of the SDRAM 50 through a sequence of time-limited write operations. In each operation, the SDRAM 50 attempts to store test data (furnished by the tester 52) to a selected memory cell. After all of the write operations are completed, the tester 52 reads values from the memory cells and compares the values to the test data to determine if the write recovery time interval $t_{WR}$ of the SDRAM 50 is sufficient.

The tester 52 has a signal generator 97 to furnish the write enable signal XWE# along with commands (via RAS#, CAS#, XWE# and other signals), test data, and address signals to initiate each write operation. The tester 52 also has a clock generator 95 that is configured to furnish a clock signal CLK which the SDRAM 50 uses to clock the write operations. Referring to FIG. 4, to begin the sequence of write operations to evaluate the write recovery time interval $t_{WR}$, the tester 52 first places the SDRAM 50 in a test mode. To accomplish this, the tester 52 furnishes a load mode command LDMODE which is latched at time T0 by the SDRAM 50 and loaded into a mode register 54 (see FIG. 3) of the SDRAM 50. The command LDMODE directs the SDRAM 50 to load a mode present on the address lines.

For purposes of testing the minimum write time $t_{WR}$, the mode present on the address lines either indicates a self timed test mode or an externally timed test mode. For the externally timed mode, the SDRAM 50 depends on the tester 52 to terminate the write operation through the assertion of the write enable signal WE#. For the self timed mode, circuitry of the SDRAM 50 limits the duration of the write operation to the duration 59.

Once the tester 52 places the SDRAM 50 in one of the two test modes, the tester 52 furnishes an ACTIVE command along with a row address to activate a selected row of memory cells. The row address and the ACTIVE command are latched on the positive edge of the CLK signal at time T1. Next, after waiting a required delay $t_{RCD}$ (a required write delay interval), the tester 52 furnishes a WRITE command along with a column address for the selected memory cell which are latched by the SDRAM 50 at time T2.

Once the column address and WRITE command are latched (at time T2), the write operation and the measurement of the duration 59 begins. From time T2 until time T3 (i.e., during the duration 59), either the tester 52 (for the externally timed mode) or the SDRAM 50 (for the self-timed mode) controls the duration of the time interval 59. After the duration 59 elapses, the write operation is terminated. The tester 52 continues to perform additional write operations in the test sequence until an attempt has been made to write the test data to all of the memory cells. In some other arrangements, the test data is not written to all of the memory cells, but rather, the test data is written to a selected group of memory cells.

Referring to FIG. 3, to aid in testing the write recovery time interval $t_{WR}$, the SDRAM 50 has control logic 58 that receives address, commands, and control signals from the tester 52. When placed in one of the test modes, the control logic 58 selectively asserts an internal precharge signal INTERNAL_PRECHARGE# to asynchronously stop each write operation. The INTERNAL_PRECHARGE# signal is received by precharge circuitry 60 and is a command that is decoded from the SDRAM's normal input pins (e.g., the RAS#, CAS#, CS, WE and address pins). When asserted, or driven low, the INTERNAL_PRECHARGE# signal turns off any row(s) and column(s) that have been activated and stops the write operation. The control logic 58 has test logic 57 that controls the states of the INTERNAL_PRECHARGE# signal in response to the mode stored in the mode register 54. The commands received by the SDRAM 50 are decoded by a decoder 56 of the control logic 58.

Figure 5:
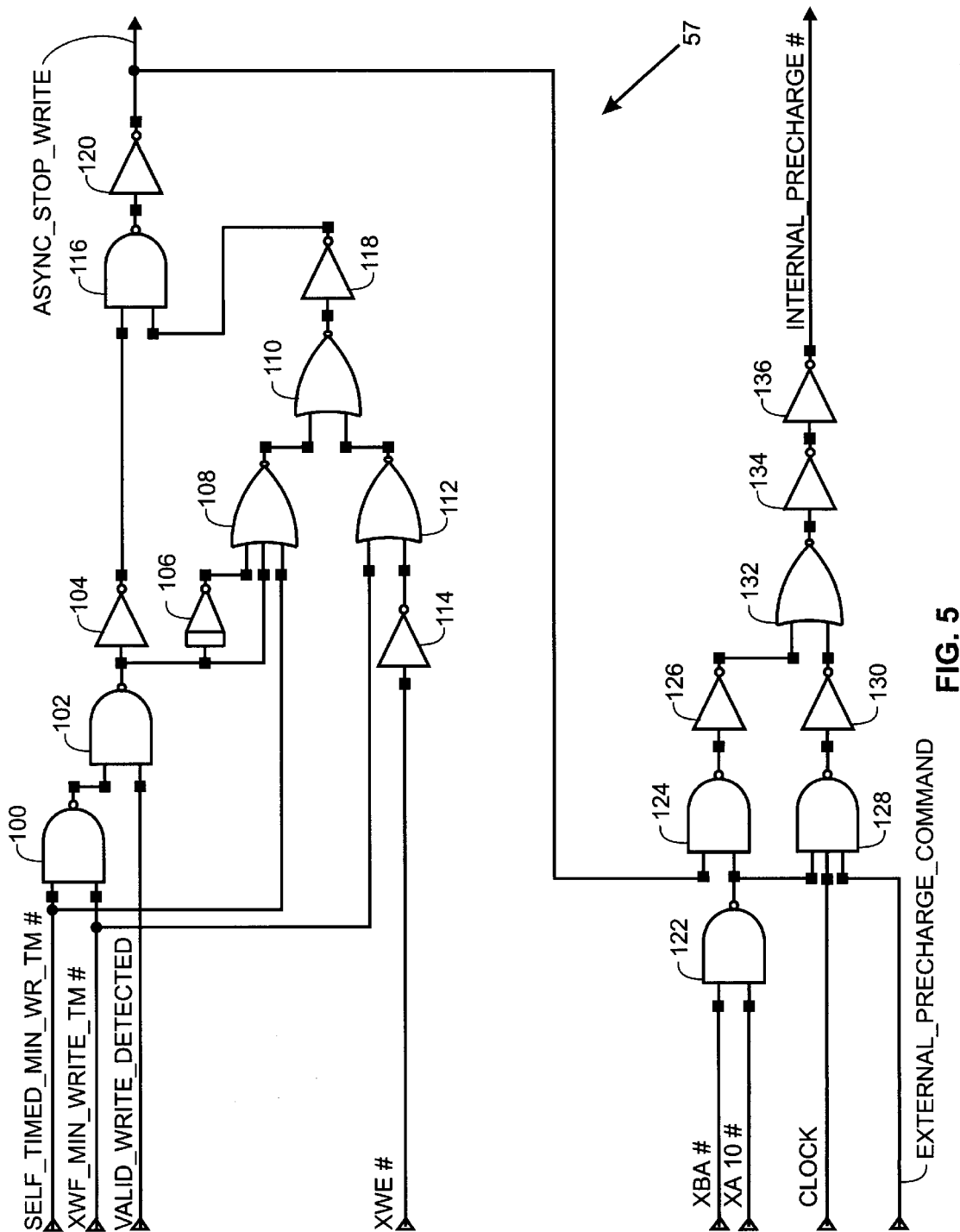
FIG. 5 is an electrical schematic diagram of logic of the memory of FIG. 3.

Referring to FIG. 5, as an example of one possible implementation of the test logic 57, a NOR gate 132 receives inputs that are indicative of when the INTERNAL_PRECHARGE# signal is to be asserted, or driven high. One input of the NOR gate 132 is asserted, or driven high, to indicate when a precharge command has been received by the SDRAM 50, and the other input of the NOR gate 132 is asserted, or driven high, to indicate when precharging is initiated by one of the test modes. The NOR gate 132 drives the INTERNAL_PRECHARGE# signal through two inverters 134 and 136 that are serially coupled to the output of the NOR gate 132.

When the SDRAM 50 is in a normal mode (i.e., a non test mode), then both a SELF_TIMED_MIN_WR_TM# signal (indicative of the self timed mode when asserted, or driven low) and a XWE_MIN_WRITE_TM# signal (indicative of the externally timed mode when asserted, or driven low) are deasserted, or driven high. In the normal mode, an ASYNC_STOP_WRITE signal (which is asserted to stop a write operation) is deasserted, or driven low, and as a result, the NOR gate 132 asserts the INTERNAL_PRECHARGE signal in response to an EXTERNAL_PRECHARGE command being received by the SDRAM 50 and two other things happening. First, either an XBA# signal or an XA10# signal must be asserted, or driven low. The XBA# and XA10# signals are selectively asserted by the tester 52 to select one of two memory banks 61 (see FIG. 3) of the SDRAM 50 for precharging. Second, the clock signal CLK must be high. If these conditions are present, then the INTERNAL_PRECHARGE# signal is asserted when the SDRAM 50 receives and latches the EXTERNAL_PRECHARGE command.

To control the state of the INTERNAL_PRECHARGE# signal during the normal mode, the test logic 57 includes a NAND gate 122 that receives the XBA# and XA10# signals. The output of the NAND gate 122 is connected to one input of a NAND gate 128 which also receives the CLK signal and an EXTERNAL_PRECHARGE_COMMAND signal which is asserted, or driven high, to indicate when the SDRAM 50 has received and latched the EXTERNAL_PRECHARGE command. The output of the NAND gate 128 passes through an inverter 130 to one of the two inputs of the NOR gate 132.

The other input of the NOR gate 132 (indicative of when precharging is initiated by one of the test modes) remains deasserted, or low, during the normal mode. To keep this input of the NOR gate 132 deasserted, the output of the NAND gate 122 is connected to one input of a NAND gate 124. The other input of the NAND gate 124 receives the ASYNC_STOP_WRITE signal. The output of the NAND gate 124 passes through an inverter 126 to the other input of the NOR gate 132.

If the SDRAM 50 is in one of the test modes, then the assertion of the INTERNAL_PRECHARGE# signal is controlled by the ASYNC_STOP_WRITE signal. When the ASYNC_STOP_WRITE signal is asserted, or driven high, the INTERNAL_PRECHARGE# signal is asserted, or driven low. When the ASYNC_STOP_WRITE signal is deasserted, or driven low, the INTERNAL_PRECHARGE# signal is asserted, or driven low.

A NAND gate 116 has two inputs that are both asserted, or driven high, to indicate when the ASYNC_STOP_WRITE signal is to be asserted, or driven high. One input of the NAND gate 116 is asserted, or driven high, when the SDRAM 50 is in one of the $t_{WR}$ test modes and a valid write command has been received by the SDRAM 50. The other input of the NAND gate 116 is asserted, or driven high, after the time interval 59 elapses.

To furnish one input to the NAND gate 116, the logic 57 has a NAND gate 100 that receives the SELF_TIMED_MIN_WR_TM# and XWE_MIN_WRITE_TM# signals. The output of the NAND gate 100 is connected to one input of a NAND gate 102 that also receives a VALID_WRITE_DETECTED signal that is asserted, or driven high, to indicate when a valid write command has been received and latched by the SDRAM 50. The output of the NAND gate 102 is furnished through an inverter 104 to one input of the NAND gate 116.

The other input of the NAND gate 116 indicates when the duration 59 elapses. Because the time interval 59 may be measured externally (via the XWE# signal) or internally (by the SDRAM 50), the test logic 57 has a NOR gate 110. When one of the inputs of the NOR gate 110 is high, the duration has elapsed. The output of the NOR gate 110 is furnished to the other input of the NAND gate 116 through an inverter 118.

One input of the NOR gate 110 is furnished by an NOR gate 108 which has three inputs. One input of the NOR gate 108 receives the SELF_TIMED_MIN_WR_TM# signal. Another input of the NOR gate 108 is connected to the output of the NAND gate 102. As a result of this arrangement, when the SDRAM 50 is in the self timed mode and a valid write command is detected, these two inputs of the NOR gate 108 are negated. The third input of the NOR gate 108 controls when the duration 59 (in the self timed mode) expires. The third input of the NOR gate 108 receives the output of a delay element 106 which introduces a propagation delay to set the duration 59.

The delay element 106 receives the output of the NAND gate 102 and prevents a change in the output of NAND gate 102 from reaching the third input of the NOR gate 108 until the time interval 59 elapses. As a result, when the output of the NAND gate 102 is asserted, or driven high, (to indicate the self timed mode and the receipt of a valid write command) the delay element 106 keeps the input of the NOR gate 110 from being driven high (and the ASYNC_STOP_WRITE signal from being asserted, or driven high) until the time interval 59 elapses.

The delay element 106 may be one of several types of delay elements, including a finite delay element, a variable delay element or a programmable delay element. The propagation delay introduced by the delay element 106 (i.e., the time interval 59) may be set by loading different delay values into the register 54 during the test mode. In this arrangement, the delay element 106 includes several delay sections, and the bits of the delay value loaded into the register 54 controls switches which are used to selectively connect the delay sections into the propagation path of the delay element 106. The propagation delay may also be set by using trim type fuse options to fine tune the propagation delay to account for process variations.

The other input of the NOR gate 110 is driven high to indicate when the SDRAM 50 is in the externally timed mode and the write enable signal XWE# is asserted by the tester 52. This input of the NOR gate 110 is furnished by the output of a NOR gate 112. One input of the NOR gate 112 is connected to the output of an inverter 114 that receives the write enable signal XWE#. The other input of the NOR gate 112 receives the XWE_MIN_WRITE_TM# signal.

Referring back to FIG. 3, the SDRAM 50 also has a row decoder 64 and a row address latch 66 for each bank of memory cells 61. To process the column addresses, the SDRAM 50 has a column address latch 90 that receives column addresses from an address register 74 which also furnishes row addresses to a row address multiplexer 68. The latch 90 is coupled to a burst counter 91 which is coupled to a column address buffer 92. The column address buffer 92 furnishes addresses to a column decoder 93 that is coupled to both sets of the circuitry 60. The row address multiplexer 68 selectively provides row addresses to the row address latches 66 and receives the output of a refresh counter 70. The operation of the refresh counter 70 is controlled by a refresh controller 72. The SDRAM 50 also has data output 78 and data input 80 registers.

Other embodiments are within the scope of the following claims. For example, the SDRAM 50 is just one example of an arrangement that can be implemented in other electronic devices and other memory devices. The SDRAM may be constructed to evaluate other timing parameters of the SDRAM. These timing parameters may have a duration near or less than the period of the test clock signal. As examples, a read to precharge time $t_{RP}$, an active bank A to active bank B command period $t_{RRD}$, an active read or write delay $t_{RCD}$, and a clock cycle time $t_{CK}$ may be evaluated. Besides testing timing properties of a SDRAM, properties of another memory device (e.g., a DRAM, a rambus device or any other memory product) may be tested.

Also, besides the XWE# signal, a single input, multiple inputs or a combination of inputs may be used to initiate, terminate, or otherwise control an operation of the memory device.

The above-described technique may be used to test any parameter that is normally referenced from either a rising or falling edge of a clock signal or any other signal(s). Stated differently, the above described technique may be used to test any interdependent signals.

In the arrangements described above, the operation is asynchronously halted. However, in other embodiments, the electronic device uses an asynchronous delay to delay the beginning of the operation. Thus, in these embodiments, external control signal(s) indicate(s) the beginning of an operation. However, the operation does not actually begin until the asynchronous delay expires.

In other embodiments, both the starting and the stopping of the operation are asynchronously controlled. In this manner, an external control signal(s) indicate(s) a pseudo beginning and ending of an operation. However, the operation does not actually begin until one asynchronous delay expires after the pseudo beginning and does not end until another asynchronous delay expires after the pseudo ending.

What is claimed is:

1. A method for testing an electronic device, the electronic device capable of controlling an operation during a normal mode in response to the detection of both a predetermined state of a first signal and a predetermined state of a second signal, the method comprising:

during a test mode of the electronic device, detecting the predetermined state of the first signal; and controlling the duration of the operation during the test mode in response to the step of detecting the predetermined state of the first signal without using the predetermined state of the second signal.

2. The method of claim 1, wherein the second signal comprises a clock signal and the predetermined state of the second signal comprises an edge of the clock signal.

3. The method of claim 1, wherein the step of controlling includes halting the operation.

4. The method of claim 1, wherein the step of controlling includes beginning the operation.

5. The method of claim 1, wherein the step of controlling includes:

generating a delay after the step of detecting.

6. The method of claim 5, wherein the step of controlling further includes halting the operation after the step of generating.

7. The method of claim 5, wherein the step of controlling further includes beginning the operation after the step of generating.

8. A method for testing an electronic device, comprising:

initiating a synchronous operation of the electronic device;

in response to the initiation, using circuitry of the electronic device to asynchronously measure a duration of time of the operation; and controlling the synchronous operation in response to the expiration of the duration of time.

9. The method of claim 8, wherein the electronic device comprises a semiconductor memory device.

10. The method of claim 8, wherein the causing step includes the step of furnishing a command to the electronic device.

11. The method of claim 8, wherein the controlling step includes the step of halting the operation.

12. The method of claim 8, wherein the controlling step includes the step of starting the operation.

13. The method of claim 8, wherein the electronic device comprises a semiconductor memory device and the operation comprises a write operation.

14. The method of claim 8, further comprising the step of synchronizing the operation to a clock signal.

15. The method of claim 8, wherein the electronic device comprises a synchronous dynamic random access memory.

16. The method of claim 8, wherein the duration of time comprises a minimum write recovery time.

17. A method for use with an electronic device capable of performing an operation synchronized to a clock signal, the clock signal having timing edges, comprising:

furnishing a command to the electronic device to initiate the operation, the command being latched by the electronic device on one of the timing edges; and using circuitry of the electronic device to control a duration of the operation, the duration being independent of the timing edges.

18. The method of claim 17, further comprising:

furnishing a signal external to the electronic device to enable the operation; and terminating the operation independently of a state of the signal.

19. The method of claim 17, wherein the electronic device comprises a memory device.

20. The method of claim 17, wherein the electronic device comprises a synchronous dynamic random access memory.

21. The method of claim 17, wherein the operation comprises a write operation.

22. A method for testing a memory device comprising:

providing a clock signal to the memory device;

furnishing a sequence of commands to the memory device for storing first data in memory cells of the memory device, the memory device performing operations in response to each of the commands, the operations being synchronized to the clock signal;

asynchronously halting at least one of the operations;

reading second data from the memory cells after the sequence of commands; and comparing the first and second data.

23. The method of claim 22, wherein the halting step includes a step of initiating precharging of the memory cells.

24. The method of claim 22, wherein said at least one of the operations comprises a write operation.

25. A memory device comprising:

a memory cell;

a circuit configured to, in a normal mode, receive an external operation enable signal, perform an operation on the memory cell when the operation enable signal indicates a first state, and terminate the operation when the operation enable signal indicates a second state; and test logic configured to, in a test mode, interact with the circuit to terminate the operation after the operation enable signal indicates the first state and before the operation enable signal indicates the second state.

26. The memory device of claim 25, wherein the test logic is configured to terminate the operation after a predetermined duration of time elapses from when the operation enable signal indicates the first state.

27. The memory device of claim 25 wherein the memory device comprises a synchronous dynamic random access memory.

28. The memory device of claim 25, wherein the circuit comprises a precharge circuit, and the test logic is configured to terminate the operation by turning on the precharge circuit.

* * * * *